United States Patent
Yeom

(10) Patent No.: US 8,399,917 B2
(45) Date of Patent: Mar. 19, 2013

(54) SEMICONDUCTOR DEVICES INCLUDING BURIED GATE ELECTRODES INCLUDING BITLINE SHOULDER ATTACK PROTECTION AND METHODS OF FORMING SUCH SEMICONDUCTOR DEVICES

(75) Inventor: Kye-Hee Yeom, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 680 days.

(21) Appl. No.: 12/591,620

(22) Filed: Nov. 25, 2009

(65) Prior Publication Data
US 2010/0140676 A1    Jun. 10, 2010

(30) Foreign Application Priority Data
Dec. 9, 2008   (KR) .................. 10-2008-0124434

(51) Int. Cl.
*H01L 29/66* (2006.01)
(52) U.S. Cl. ....................... 257/306; 257/330
(58) Field of Classification Search .......... 257/306, 257/330; 438/253, 270
See application file for complete search history.

(56) References Cited

U.S. PATENT DOCUMENTS

| 7,713,873 B2* | 5/2010 | Kim et al. ............... 438/672 |
| 7,749,834 B2* | 7/2010 | Park et al. ............... 438/239 |
| 2006/0205141 A1 | 9/2006 | Park et al. |
| 2008/0284029 A1 | 11/2008 | Kim et al. |

FOREIGN PATENT DOCUMENTS

| JP | 2003-158201 A | 5/2003 |
| KR | 10-2004-0017982 A | 2/2004 |
| KR | 10-0577542 B1 | 4/2006 |
| KR | 10-0843715 B1 | 6/2008 |

* cited by examiner

*Primary Examiner* — Mark Prenty
(74) *Attorney, Agent, or Firm* — Lee & Morse, P.C.

(57) ABSTRACT

A semiconductor device, including a semiconductor substrate including isolations defining active regions of the semiconductor substrate, a plurality of buried gate electrodes extending below an upper surface of the active regions of the semiconductor device, a plurality of bit lines extending on the semiconductor substrate along a first direction, a plurality of insulating patterns extending on the semiconductor substrate along a second direction that crosses the first direction, and a plurality of capping patterns extending over the bit lines, wherein the insulating patterns and the capping pattern both include insulating material and at least a portion of corresponding ones of the insulating patterns and the capping patterns are in direct contact with each other.

19 Claims, 17 Drawing Sheets

SEMICONDUCTOR DEVICES INCLUDING BURIED GATE ELECTRODES INCLUDING BITLINE SHOULDER ATTACK PROTECTION AND METHODS OF FORMING SUCH SEMICONDUCTOR DEVICES

BACKGROUND

1. Field

Embodiments relate to buried channel array transistor (BCAT) devices and methods of forming BCAT devices. More particularly, embodiments relate to a BCAT memory device that protects a cell bit line from shoulder attacks, has improved short margins, and/or has reduced loading capacitance relative to conventional devices.

2. Description of the Related Art

As semiconductor devices are becoming more and more integrated, device characteristics may suffer. For example, threshold voltages of devices, e.g., transistors, may be lowered. Refresh characteristics may also be degraded as channel lengths of transistors are shortened. Buried channels may be employed to help alleviate, e.g., such problems. More particularly, in a memory device, e.g., dynamic random access memory (DRAM) including BCATs, a loading capacitance of the bit lines may be relatively high, a short margin of a storage node may be relatively small, etc. Thus, devices having improved characteristics are desired.

SUMMARY

Embodiments are therefore directed to semiconductor devices and methods of fabricating semiconductor devices, which substantially overcome one or more of the problems due to the limitations and disadvantages of the related art.

It is therefore a feature of an embodiment to provide semiconductor devices, e.g., DRAM device, including a BCAT and bit line shoulder attack protection.

It is therefore a feature of an embodiment to provide semiconductor devices, e.g., DRAM device, including a BCAT and having a conductive pattern, e.g., a bit line, arranged directly on a semiconductor substrate and/or directly connected to an active area of the semiconductor substrate, e.g., source/drain of the BCAT.

It is therefore a separate feature of an embodiment to provide semiconductor devices, e.g., DRAM device, including a BCAT and having a lower bit line loading capacitance relative to conventional devices.

It is therefore a feature of an embodiment to provide semiconductor devices that include a BCAT and have a shorter height relative to conventional devices.

It is therefore a separate feature of an embodiment to provide methods of forming semiconductor devices in which node short margins between, e.g., bit lines, buried contacts, storage nodes, etc., are improved.

At least one of the above and other features and advantages may be realized by providing a semiconductor device, including a semiconductor substrate including isolations defining active regions of the semiconductor substrate, a plurality of buried gate electrodes extending below an upper surface of the active regions of the semiconductor device, a plurality of bit lines extending on the semiconductor substrate along a first direction, a plurality of insulating patterns extending on the semiconductor substrate along a second direction that crosses the first direction, and a plurality of capping patterns extending over the bit lines, wherein the insulating patterns and the capping pattern both include insulating material and at least a portion of corresponding ones of the insulating patterns and the capping patterns are in direct contact with each other.

Each of the plurality of bit lines may include a conductive pattern protruding from the respective bit line and directly contacting and overlapping a corresponding one of the active regions of the semiconductor substrate.

Each of the conductive patterns may be arranged between two adjacent ones of the buried gate electrodes and overlaps a common source/drain region of the adjacent buried gate electrodes in the respective active region of the semiconductor substrate.

The bit lines may be arranged directly on the semiconductor substrate.

The capping pattern may extend over the conductive patterns.

The insulating patterns and the capping pattern may form a closed insulating path along a plane parallel to the upper surface of the semiconductor substrate.

The semiconductor device may include a plurality of conductive pads arranged on the semiconductor substrate.

The conductive pads may be arranged between adjacent portions of the capping patterns and the insulating patterns.

The conductive pads may be surrounded by respective portions of the capping patterns and the insulating patterns along a plane extending along the first and second directions.

The conductive pads may be arranged directly on respective source/drain regions of the semiconductor substrate.

The semiconductor device may include a spacer between each of the conductive pads and adjacent respective portions of the insulating patterns and the capping patterns.

Sidewalls of the conductive pads may be surrounded by the respective spacer.

The insulating patterns may overlap respective portions of the isolations.

The first direction may be substantially and/or completely perpendicular to the second direction.

The capping pattern and the insulating patterns may include the same one or more insulating materials.

The capping pattern and the insulating pattern may include silicon nitride.

Upper surfaces of the capping pattern and the insulating pattern may extend along a same plane.

At least one of the above and other features and advantages may be separately realized by providing a method of forming a semiconductor device, the method including forming isolation trenches and buried gate trenches in a semiconductor substrate, the isolation trenches defining active regions of the semiconductor substrate, forming a plurality of buried gate electrodes extending below an upper surface of the active regions of the semiconductor device, forming a plurality of bit lines on the semiconductor substrate, the bit lines extending along a first direction, forming a plurality of insulating patterns on the semiconductor substrate, the insulating patterns extending along a second direction that crosses the first direction, and forming a plurality of capping patterns extending over the bit lines, wherein the insulating patterns and the capping pattern both include insulating material and at least a portion of corresponding ones the insulating patterns and the capping patterns are in direct contact with each other.

Forming the plurality of capping patterns occurs after forming the plurality of insulating patterns.

Forming the plurality of capping patterns may occur before forming the plurality of insulating patterns.

Forming the plurality of bit lines may include forming a conductive pattern protruding from the respective bit line and directly contacting and overlapping a corresponding one of the active regions of the semiconductor substrate.

The method may include forming a plurality of conductive pads on the semiconductor substrate, the conductive pads being electrically connected to respective source/drain regions of the semiconductor substrate.

The method may include forming a spacer along sidewalls of the insulating patterns, the bit lines, and the capping patterns.

At least one of the above and other features and advantages may be separately realized by providing a system, including a controller, and a memory device, the memory device including a semiconductor substrate including isolations defining active regions of the semiconductor substrate, a plurality of buried gate electrodes extending below an upper surface of the active regions of the semiconductor device, a plurality of bit lines extending on the semiconductor substrate along a first direction, a plurality of insulating patterns extending on the semiconductor substrate along a second direction that crosses the first direction, and a plurality of capping patterns extending over the bit lines, wherein the insulating patterns and the capping pattern both include insulating material and at least a portion of corresponding ones of the insulating patterns and the capping patterns are in direct contact with each other, wherein the controller is adapted to program data in and erase data from the memory device.

The memory device may be a DRAM-flash type memory system.

BRIEF DESCRIPTION OF THE DRAWINGS

The above and other features and advantages of embodiments will become more apparent to those of ordinary skill in the art by describing in detail exemplary embodiments thereof with reference to the attached drawings, in which.

DETAILED DESCRIPTION

Korean Patent Application No. 2008-0124434, filed on Dec. 9, 2008, in the Korean Intellectual Property Office, and entitled: "Semiconductor Device With Have Buried Gate Electrode Structure Without Bitline Shoulder Attack And Method For Manufacturing The Same," is incorporated by reference herein in its entirety.

Embodiments of one or more aspects of the invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art. Further, some elements that are not essential to the complete understanding of the exemplary embodiments and/or are well known may be omitted. For example, when describing a transistor gate structure, a description of a gate oxide layer may be omitted.

Figure 1A:
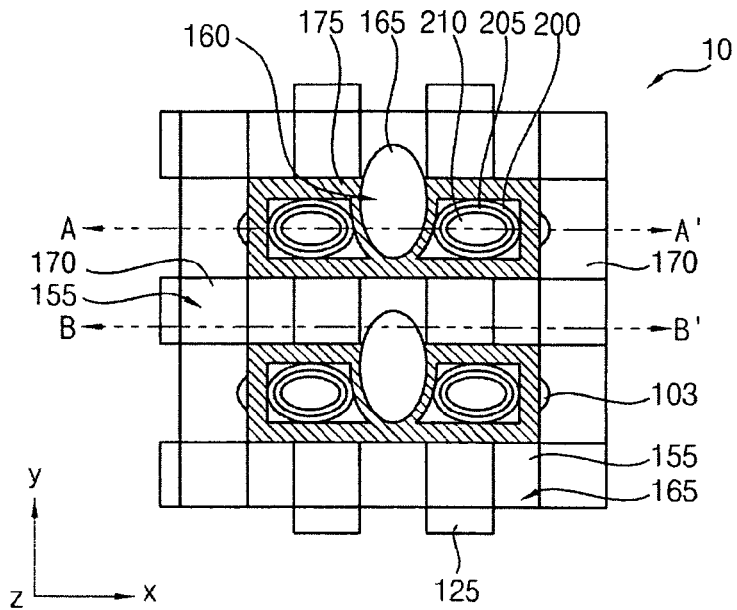
FIGS. 1A, 1B, and 1C illustrate cross-sectional views of an exemplary DRAM device including a BCAT structure according to an exemplary embodiment.
Figure 1B:
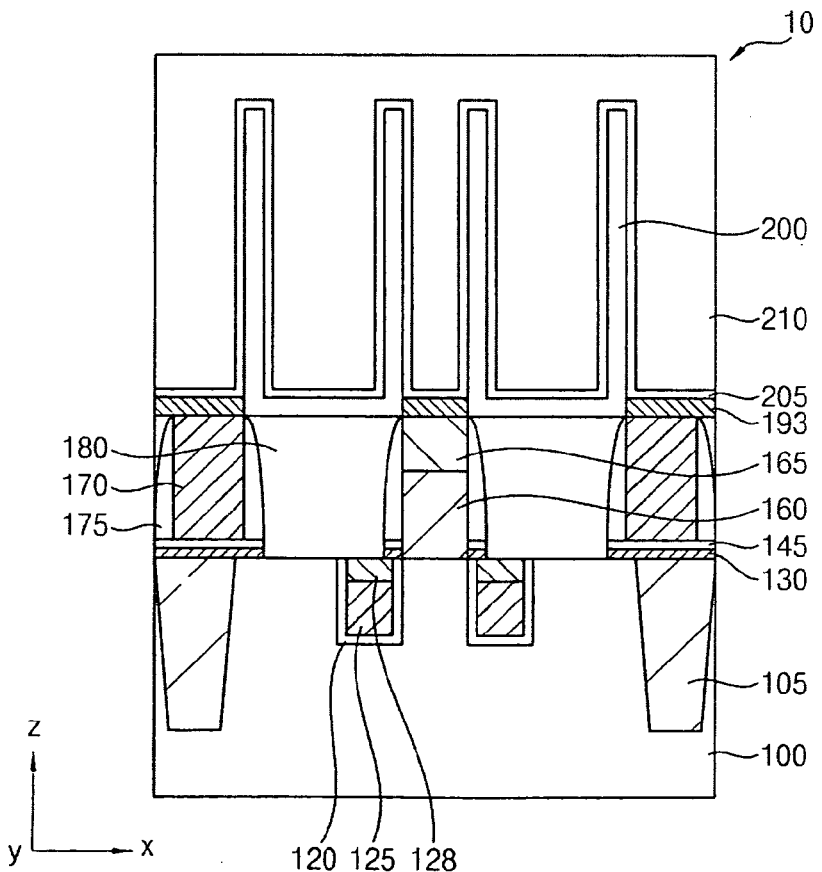
Figure 1C:
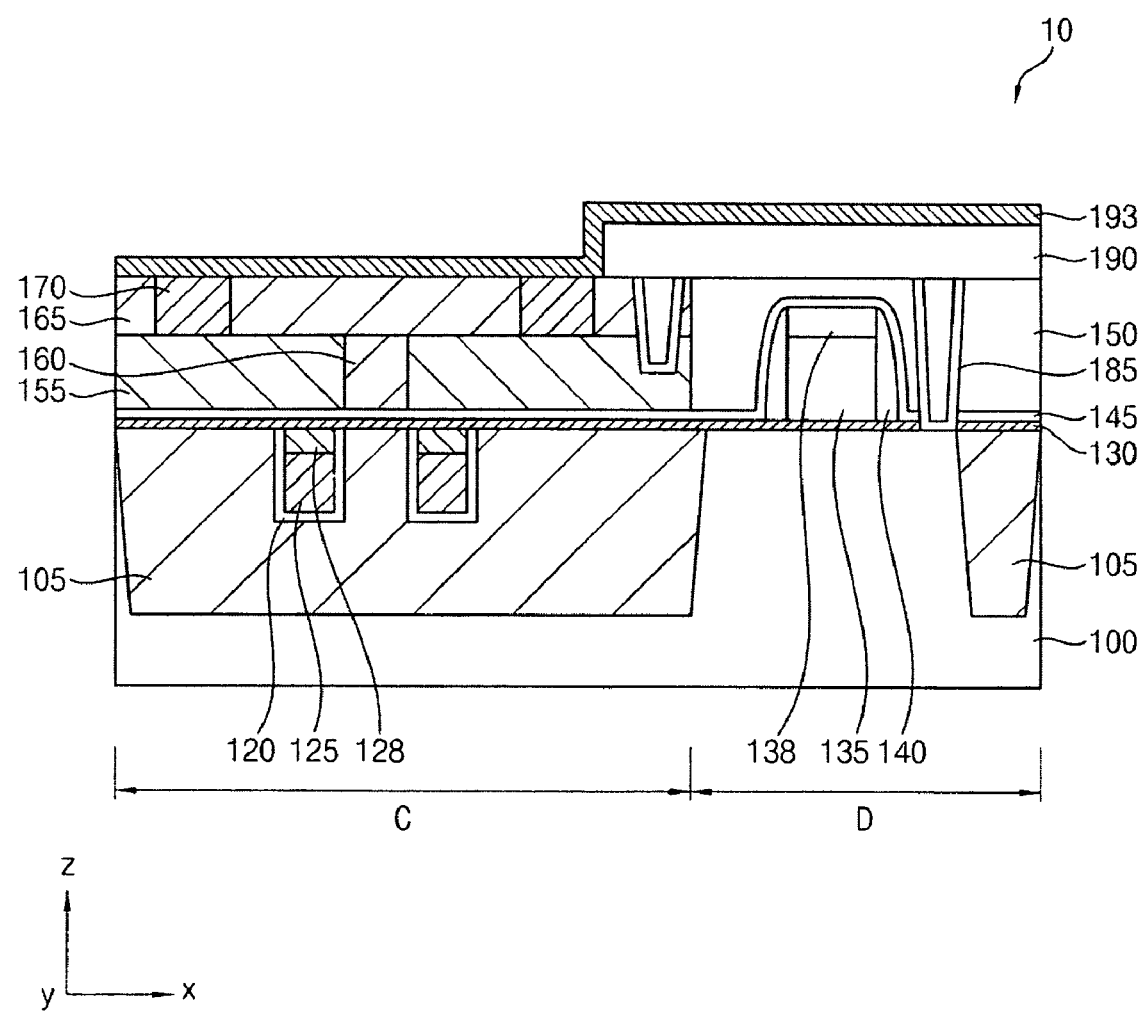

FIGS. 1A, 1B, and 1C illustrate cross-sectional views of an exemplary DRAM device 10 including a BCAT structure according to an exemplary embodiment. More particularly, FIG. 1A illustrates a cross-sectional view of the DRAM device 10 along an x-y plane, FIG. 1B illustrates a cross-sectional view of the DRAM device 10 along line A-A' of FIG. 1A, and FIG. 1C illustrates a cross-sectional view of the DRAM device 10 along line B-B' of FIG. 1A. Further, in FIG. 1C, region C corresponds to a cell region of the DRAM device 10 and region D corresponds to a periphery region of the DRAM device 10.

Referring to FIGS. 1A, 1B, and 1C, the DRAM device 10 may include a semiconductor substrate 100, an isolation 105, a buried gate insulating layer 120, a gate electrode 125, a gate capping pattern 128, a gate insulating layer 130, a periphery gate electrode 135, a periphery capping pattern 138, a periphery spacer 140, an etch stop layer 145, a first insulating pattern 150, a first conductive pattern 155, e.g., cell bit line, a second conductive pattern 160, e.g., direct connect (DC) plug, a capping pattern 165, a second insulating pattern 170, a spacer 175, a conductive pad, e.g., a capacitor pad 180, a periphery bit line barrier 185, a periphery bit line conductive pattern 190, e.g., tungsten, titanium, nitride, and/or copper, etc., a second etch stop layer 193, a capacitor lower electrode 200, a capacitor dielectric 205, and a capacitor upper electrode 210.

Referring to FIGS. 1A, 1B, and 1C, the capping pattern 165 and the second insulating pattern 170 may together define a path around each of the active areas 103. More particularly, the capping pattern 165 and the second insulating pattern 170 may together define a closed insulating path along a plane, e.g., an x-y plane, of the DRAM device 10.

As shown in FIG. 1A, the spacer 175 may further define isolated portions within the insulating path of the capping pattern 165 and the second insulating pattern 170. The spacer 175 may substantially surround each of the capacitor pads 180 along a plane, e.g., an x-y plane, of the DRAM device 10. The spacer 175 may be arranged along the second conductive pattern 160 and one or more adjacent ones of the first conductive patterns 155, e.g., adjacent one of the bit lines, and/or adjacent ones of the second insulating pattern 170.

More particularly, referring to FIGS. 1A, 1B, and 1C, the spacers 175, capping pattern 165 and/or second insulating patterns 170 may be arranged so as to electrically isolate conductive patterns that are in relatively close proximity to each other. For example, the spacers 175, the capping pattern 165 and/or the second insulating patterns 170 may be arranged such that adjacent ones of the second conductive pattern 160 and the first conductive patterns 155, adjacent ones of the capacitor pads 180 and the first conductive patterns 155, etc, may be electrically isolated and may protect the first conductive patterns 155, e.g., bit lines, to be free of shoulder attacks, may reduce electrical shorts between, e.g., the first conductive patterns 155 and the capacitor pads 180, and/or may reduce bit line loading capacitance. As a result, performance of the DRAM device 10 may be improved.

FIGS. 2A, 3A, 4A, 5A, 6A, 7A, 8A, 9A, and 10A illustrate exemplary layout diagrams of recess 118 and active areas 103 employable by and/or during formation of the DRAM device 10 of FIGS. 1A, 1B, and 1C. FIGS. 2B, 3B, 4B, 5B, 6B, 7B, 8B, 9B, and 10B illustrate the cross-sectional views of intermediate structures in stages in an exemplary method of forming the DRAM device 10 of FIGS. 1A, 1B, and 1C, along lines A-A' of FIGS. 2A, 3A, 4A, 5A, 6A, 7A, 8A, 9A, and 10A, respectively. FIGS. 2C, 3C, 4C, 5C, 6C, 7C, 8C, 9C, and 10C illustrate the cross-sectional views of intermediate structures in stages in an exemplary method of forming the DRAM device 10 of FIGS. 1A, 1B, and 1C, along lines B-B' of FIGS. 2A, 3A, 4A, 5A, 6A, 7A, 8A, 9A, and 10A, respectively.

Figure 2A:
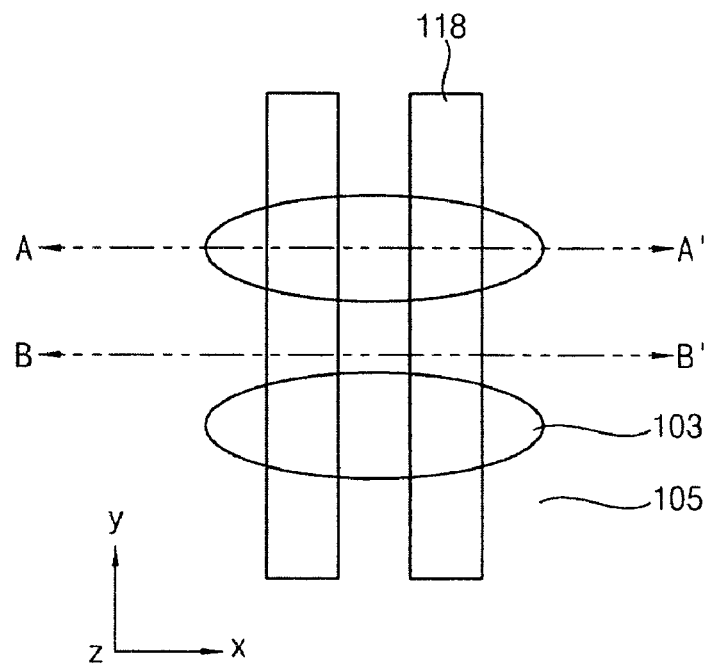
FIGS. 2A, 3A, 4A, 5A, 6A, 7A, 8A, 9A, and 10A illustrate exemplary layout diagrams of recess and active areas employable by the DRAM device of FIGS. 1A, 1B, and 1C.
Figure 2B:
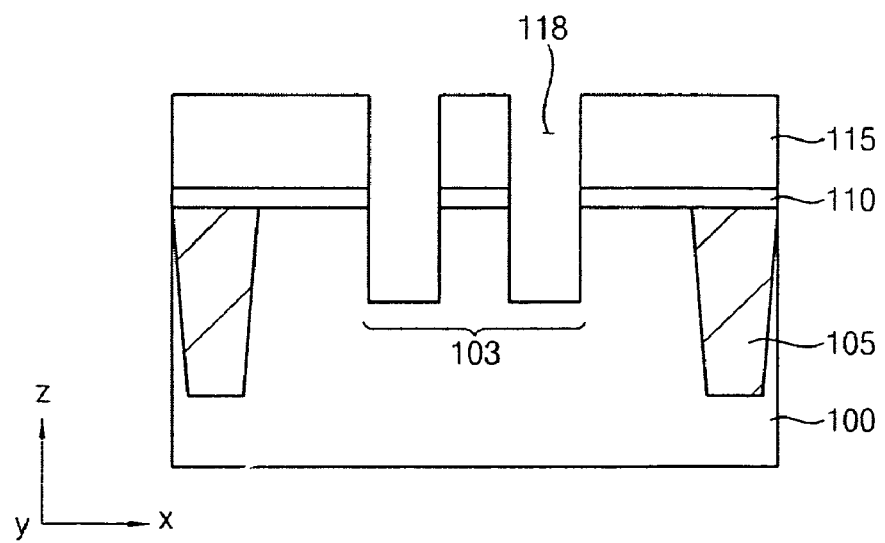
FIGS. 2B, 3B, 4B, 5B, 6B, 7B, 8B, 9B, and 10B illustrate the cross-sectional views of intermediate structures in stages in an exemplary method of forming the DRAM device of FIGS. 1A, 1B, and 1C, along lines A-A' of FIGS. 2A, 3A, 4A, 5A, 6A, 7A, 8A, 9A, and 10A, respectively.
Figure 2C:
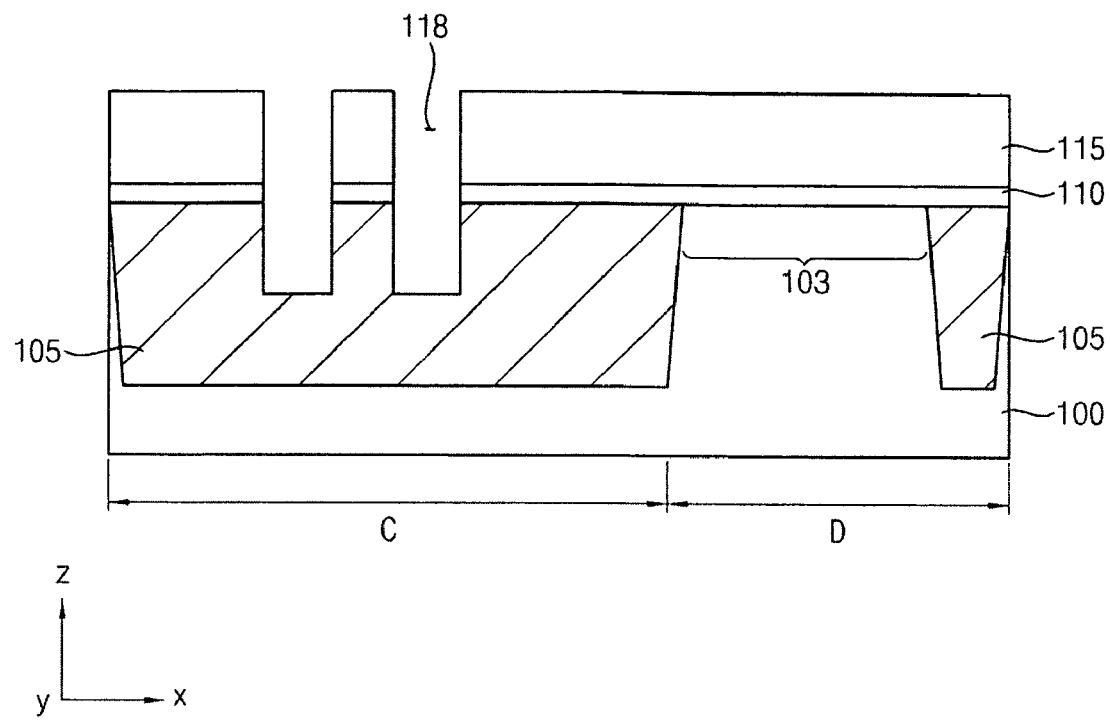
FIGS. 2C, 3C, 4C, 5C, 6C, 7C, 8C, 9C, and 10C illustrate the cross-sectional views of intermediate structures in stages in an exemplary method of forming the DRAM device of FIGS. 1A, 1B and 1C, along lines B-B' of FIGS. 2A, 3A, 4A, 5A, 6A, 7A, 8A, 9A, and 10A, respectively.

Referring to FIGS. 2A, 2B, and 2C, the semiconductor substrate 100 may be patterned to isolate portions thereof. For example, an upper portion of the semiconductor substrate 100 may be patterned to form isolations 105, e.g., via shallow trench isolation (STI). STI may include, e.g., forming a trench in the substrate 100, forming a thermal oxide layer in the trench, forming a nitride layer on the thermal oxide layer, filling the trench using, e.g., chemical vapor deposition (CVD) and/or high density plasma (HDP) deposition, and/or planarizing a resulting surface via chemical mechanical polishing (CMP). The isolations 105 may define island-type patterns that may correspond to the active areas 103.

A pad oxide 110 may be formed on the semiconductor substrate 100. The pad oxide 110 may be formed via, e.g., thermal oxidation, and may have a thickness of about 50 Angstroms to about 150 Angstroms.

A hard mask layer 115 may be formed on the pad oxide 110. The hard mask layer 115 may include, e.g., silicon nitride. The hard mask layer 115 may have a different etch selectivity than the substrate 100 and/or the pad oxide 110. In some embodiments, the hard mask layer 115 may have a multilayer structure.

The pad oxide 110 and the hard mask layer 115 may be patterned, and the patterned hard mask layer 115 may be used to form recesses 118 in the active area 103 of the substrate 100. More particularly, the pad oxide 110 and the hard mask layer 115 may be patterned in the cell region C. The recesses 118 may correspond to respective portions of the substrate 100 where gate electrodes 125 may later be formed. A lower surface of the recesses 118 may be curved, e.g., rounded, in order to increase a surface area thereof.

Figure 3A:
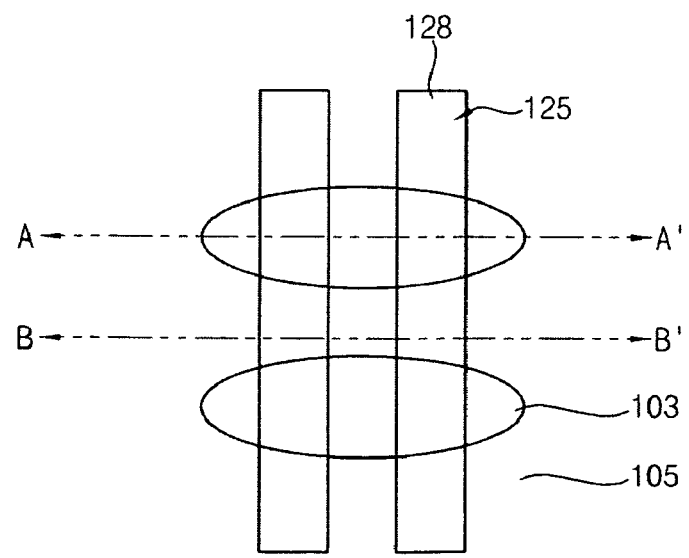
Figure 3B:
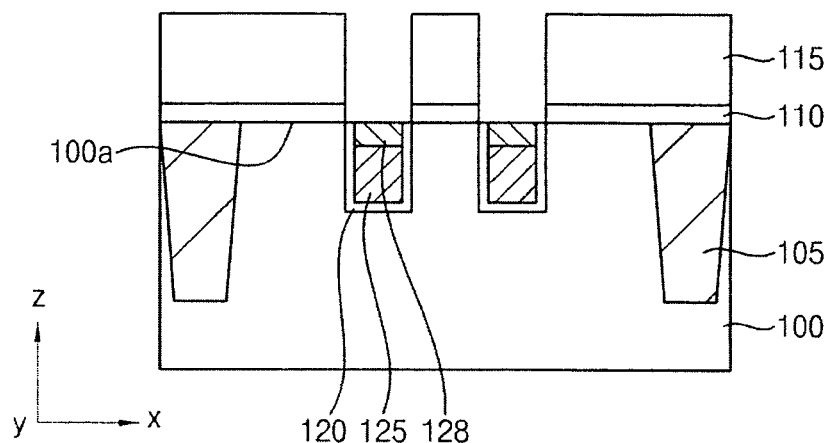
Figure 3C:
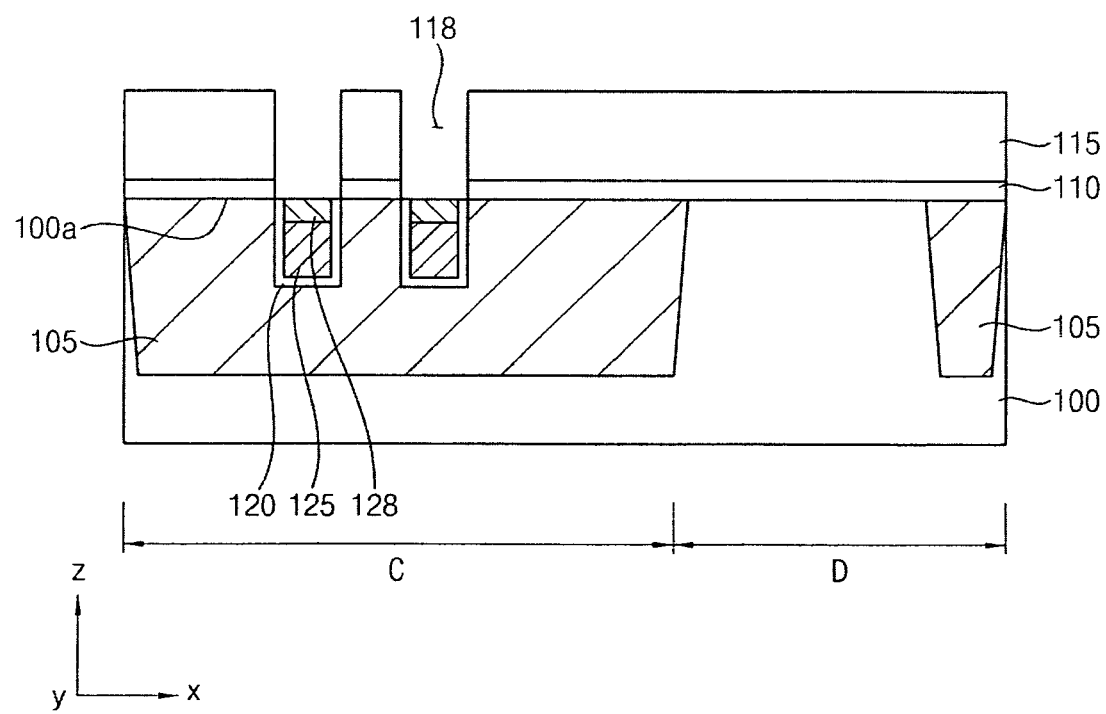

Referring to FIGS. 3A, 3B, and 3C, the buried gate insulating layer 120 may be formed on the active area 103, and, more particularly, in the recesses 118. The buried gate insulating layer 120 may include, e.g., hafnium oxide (HfOx), aluminum oxide (AlOx), tantalum oxide (TaOx), etc. In some embodiments, the buried gate insulating layer 120 may include a multilayer structure including, e.g., a lower oxide film, a nitride film and an upper oxide film. The buried gate insulating layer 120 may have a thickness of about 30 Angstroms to about 70 Angstroms.

The gate electrode 125 may be formed on the buried gate insulating layer 120 within the respective recess 118. The gate electrode 125 may be a BCAT structure such that at least a portion and/or all of the gate electrode 125 is below an upper surface 100a of the semiconductor substrate 100. By forming the gate electrode 125 partially and/or completely below the upper surface 100a of the semiconductor substrate 100, a height of the device, e.g., DRAM device 10, may be reduced. In the exemplary embodiment illustrated in FIGS. 3A, 3B, and 3C, the gate electrode 125 is completely buried below the upper surface 100a of the semiconductor substrate 100. The gate electrode 125 may extend along the y-direction so as to cross over the active area 103 extending along the x-direction. The gate electrode 125 may include, e.g., polysilicon, a metal and/or a metal compound. For example, the gate electrode 125 may include polysilicon doped with impurities, such as, e.g., titanium nitride (TiNx), tungsten nitride (WNx), tantalum nitride (TaN), titanium silicon nitride (TiSiN), and/or tungsten silicon nitride (WSiNx), etc. The gate electrode 125 may be formed using, e.g., an atomic layer deposition (ALD) process, a CVD process, etc.

The gate capping pattern 128 may be formed on the gate electrode 125. The gate capping pattern 128 may include, e.g., SiN, oxide, etc. After depositing the capping material, an etchback process, CMP, etc., may be performed.

Figure 4A:
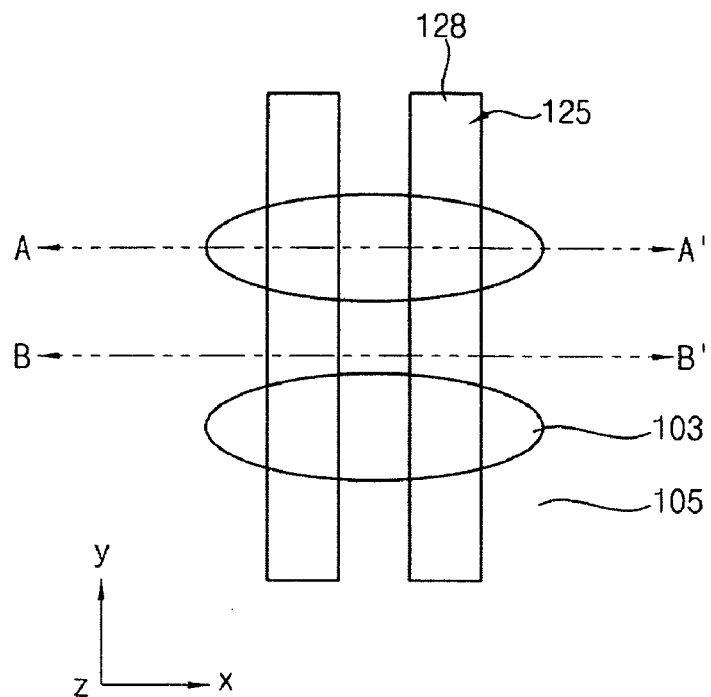
Figure 4B:
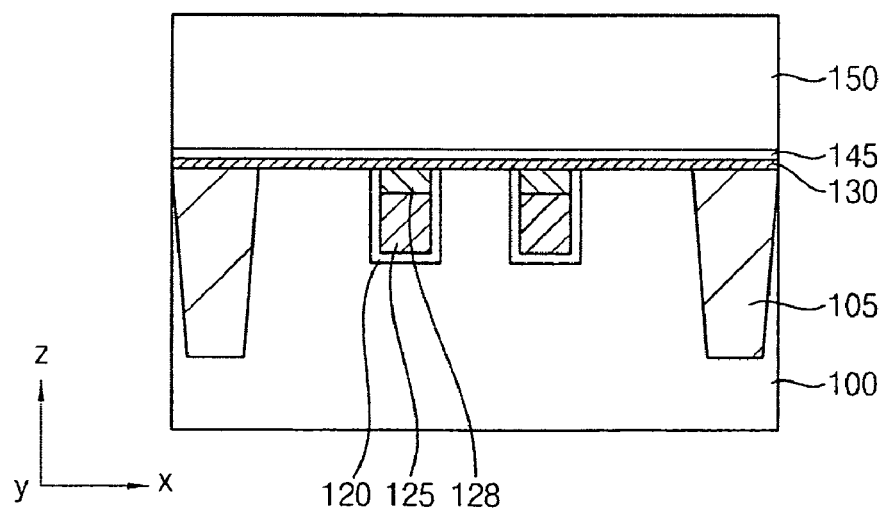
Figure 4C:
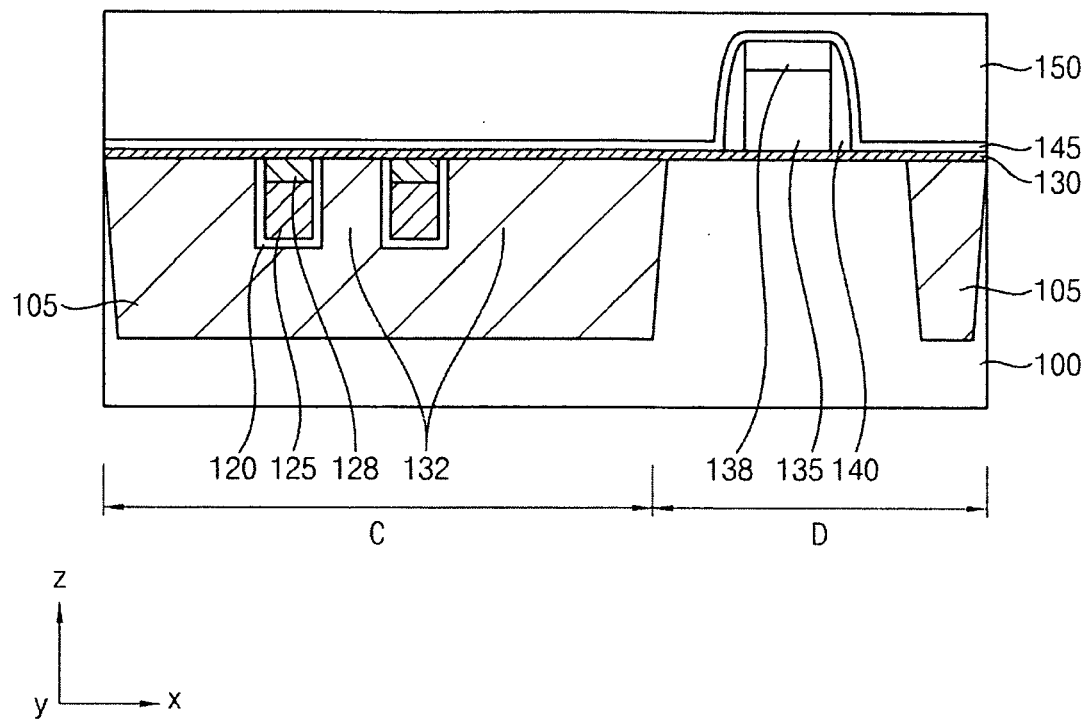

Referring to FIGS. 4A, 4B, and 4C, the pad oxide 110 and the hard mask layer 115 may be removed. The pad oxide 110 and the hard mask 115 may be removed using, e.g., a wet etch process.

The gate insulating layer 130 may be formed on the semiconductor substrate 100. In the periphery region D, the periphery gate electrode 135, the periphery capping pattern 138, and the periphery spacer 140 may be formed on the gate insulating layer 130. the gate insulating layer 130 may include same or similar materials and/or be formed using a same or similar process as the buried gate insulating layer 120. The periphery gate electrode 135 may include same or similar materials and/or be formed using a same or similar process as the gate electrode 125. The periphery spacers 140 may be formed on sidewalls of the periphery gate electrode 135. The periphery spacers 140 may include a dielectric material, e.g., silicon oxide, silicon nitride, etc. The periphery spacer forming material may be conformally formed on the periphery capping pattern 138 and the periphery gate electrode 125 before being anisotropically etched to form the periphery spacers 140.

Source/drain impurities may then be doped into respective portions of the semiconductor substrate 100. More particularly, source/drain regions 132 may be formed by doping source/drain impurities into respective portions of the cell region C and/or the periphery region D of the semiconductor substrate 100.

The etch stop layer 145 may be formed on the semiconductor substrate 100. More particularly, the etch stop layer 145 may be formed on the cell region C and the periphery region D including, e.g., the periphery capping pattern 138 and the periphery spacer 140. The etch stop layer 133 may include, e.g., nitride. The etch stop layer 133 may be formed using, e.g., a nitride CVD process. The etch stop layer 133 may have a thickness of about 100 Angstroms to about 200 Angstroms.

The first insulating pattern 150 may be formed on the etch stop layer 145. The first insulating pattern 150 may be formed using, e.g., an oxide CVD process. The first insulating pattern 150 may have a thickness of about 1000 Angstroms to about 3000 Angstroms. The first insulating pattern 150 may be planarized, e.g., using a CMP process.

Figure 5A:
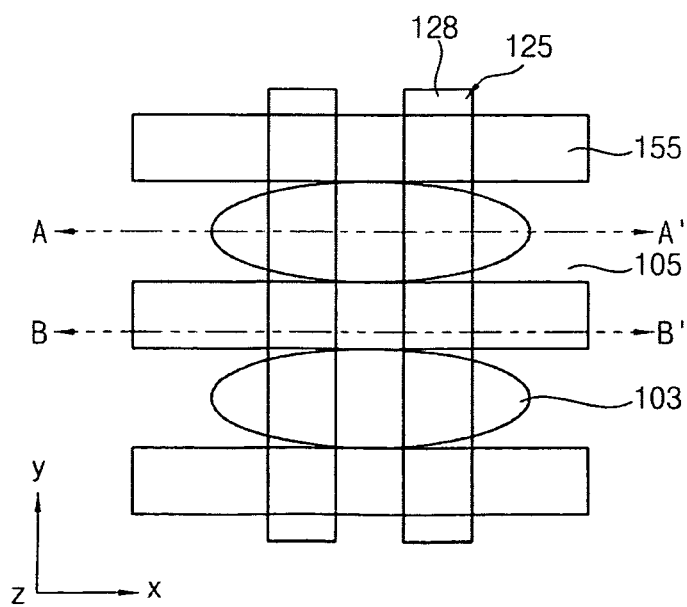
Figure 5B:
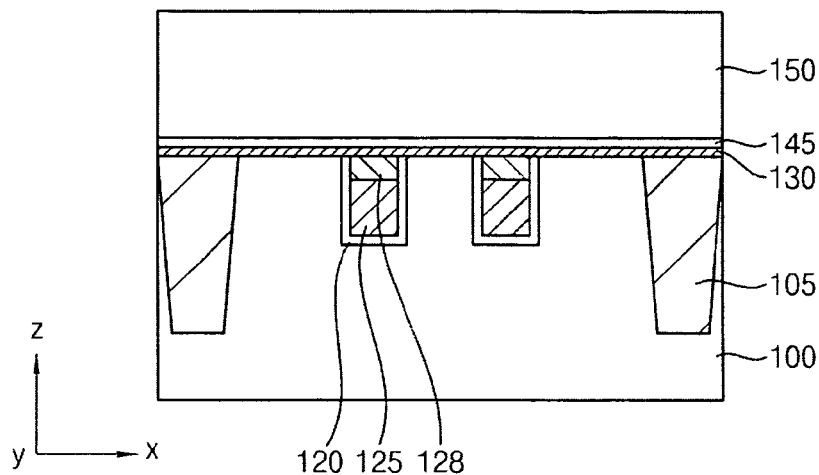
Figure 5C:
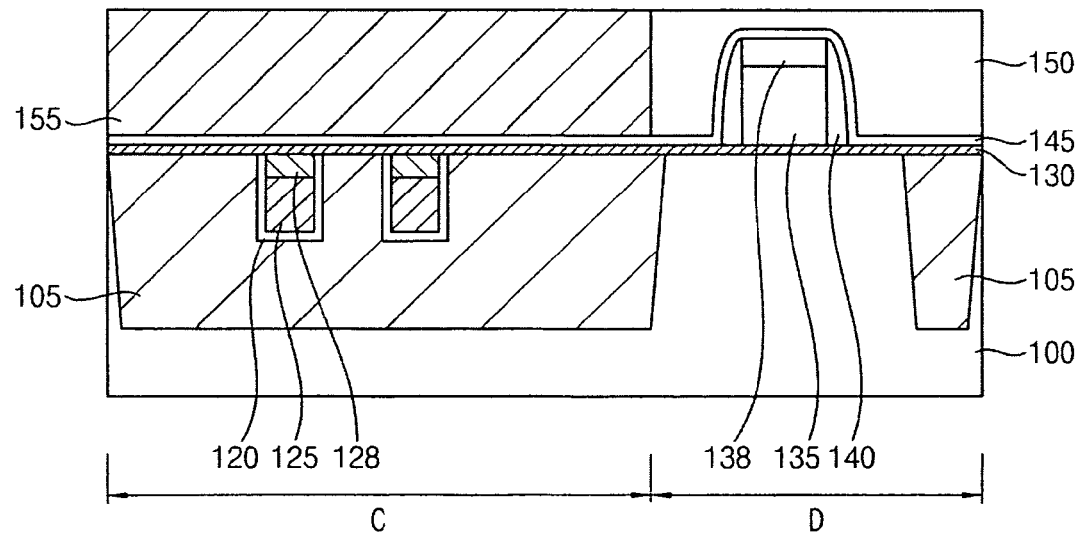

Referring to FIGS. 5A, 5B, and 5C, the first insulating pattern 150 may be patterned to form recesses corresponding to where the first conductive pattern 155, e.g., cell bit line, may be formed. The recesses may extend along the x-direction, may correspond to a plurality of the active areas 103 and may cross over a plurality of the gate electrodes 125. In general, the recesses may be spaced apart from the respective active areas 103. A portion of the recesses may be immediately adjacent to and/or slightly overlapping the respective active areas 103. The recesses may be filled with material for forming the first conductive pattern 155.

The first conductive pattern 155 may include, e.g., titanium nitride, tungsten nitride, tantalum nitride, titanium silicon nitride, and/or tungsten silicon nitride, etc.

Figure 6A:
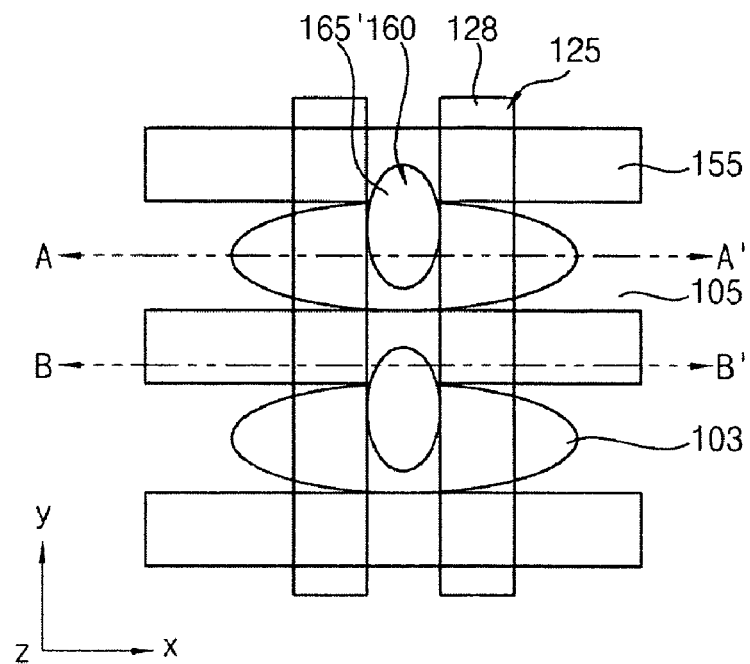
Figure 6B:
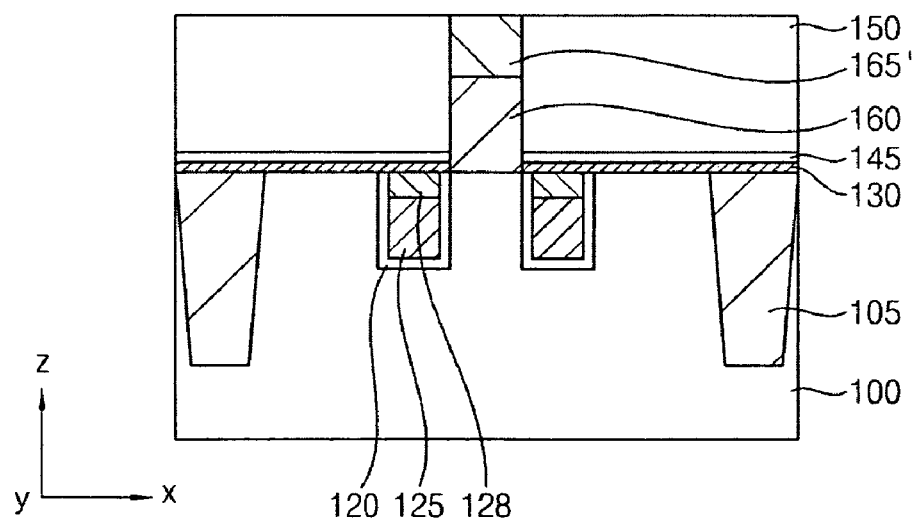
Figure 6C:
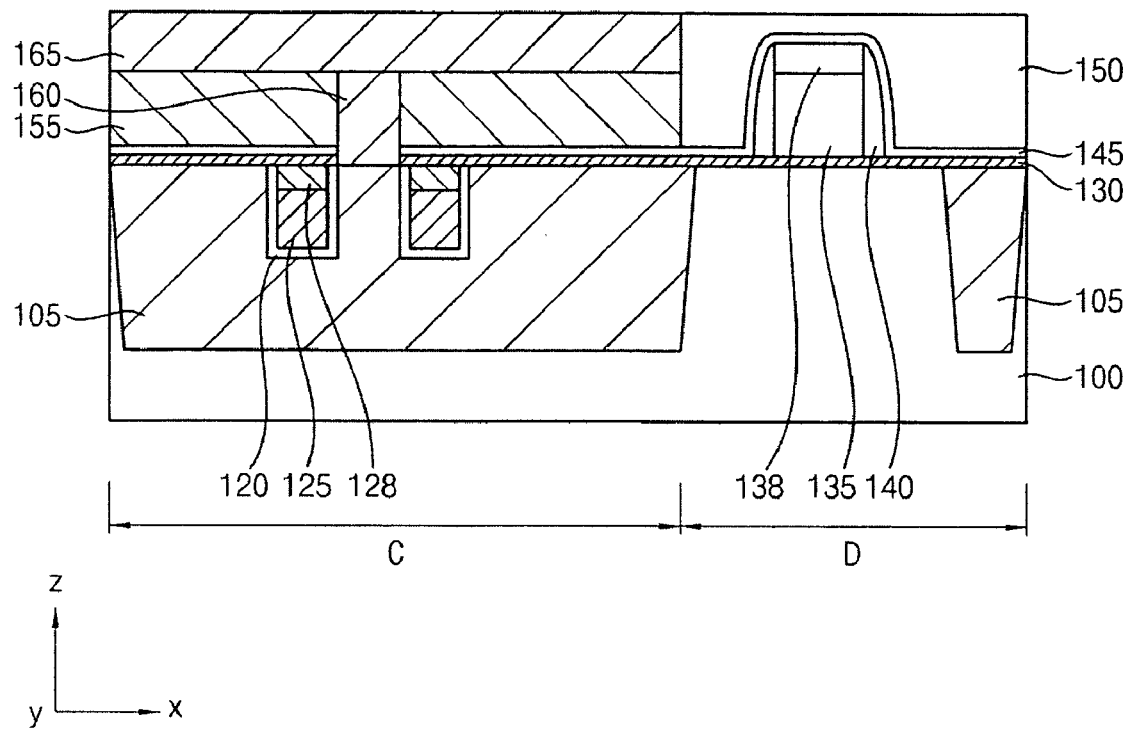

Referring to FIGS. 6A, 6B, and 6C, recesses that overlap respective ones of the source/drain regions 132 and correspond to portions of the corresponding first conductive pattern 155 may be formed in the first insulating pattern 150. In some embodiments (not shown), recesses for forming a first conductive pattern may inherently include protruding recesses overlapping, e.g., a portion of a respective active area. In some embodiments, the recesses directly overlapping respective portions of the active area 103, e.g., source/drain region 132 common to two adjacent gate electrodes 125 may be formed separately from the recesses for forming the first conductive pattern 155, e.g., may be formed after forming the first conductive pattern 155. Embodiments are not limited to such embodiments. For example, in some embodiments (not shown), an active area may include protrusions providing overlapping regions between a first conductive pattern and a respective portion of the active area.

The recesses overlapping the respective active area 103 may be filled with material for forming the second conductive pattern 160, e.g., direct connect (DC) plug. A capping pattern 165' may be formed on the second conductive pattern 160. The second conductive pattern 160 may include a same or similar materials and/or be formed using a same or similar process as the first conductive pattern 150. The recesses may be formed using, e.g., etchback. The capping pattern 165' may include, e.g., silicon nitride. After depositing material for forming the capping pattern 165', CMP may be performed to planarize an upper surface of the capping pattern 165 with the first insulating pattern 150. The capping pattern 165' may include a same material as the capping pattern 165.

Figure 7A:
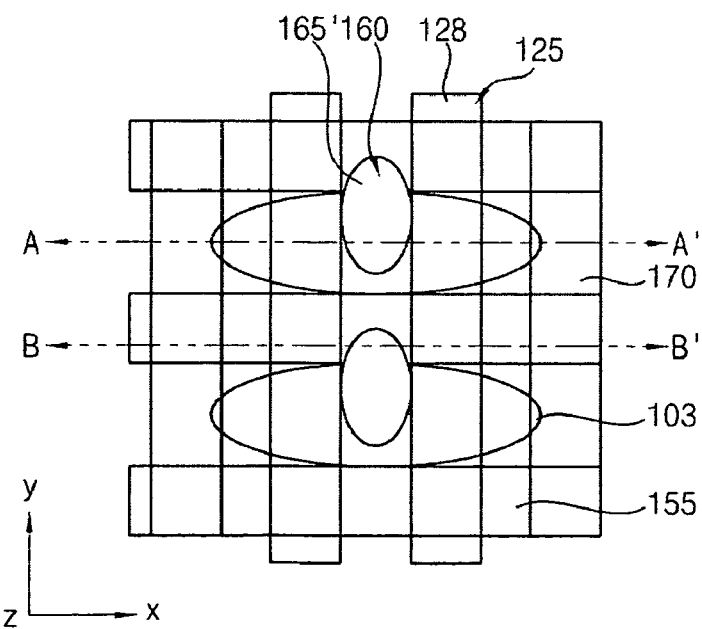
Figure 7B:
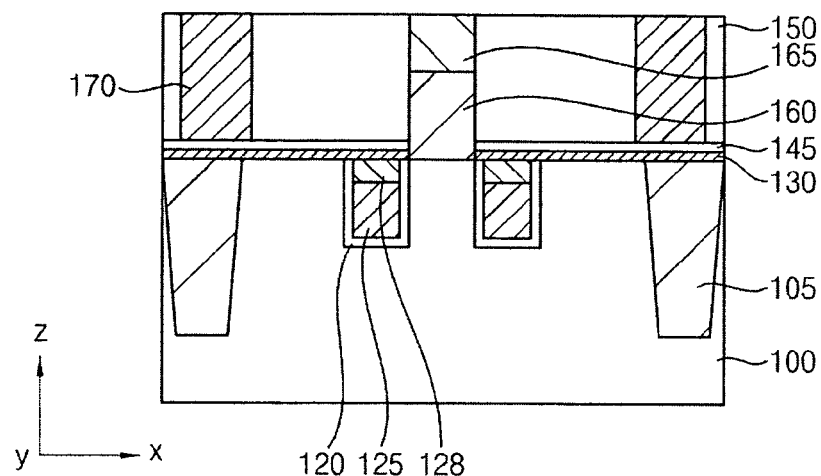
Figure 7C:
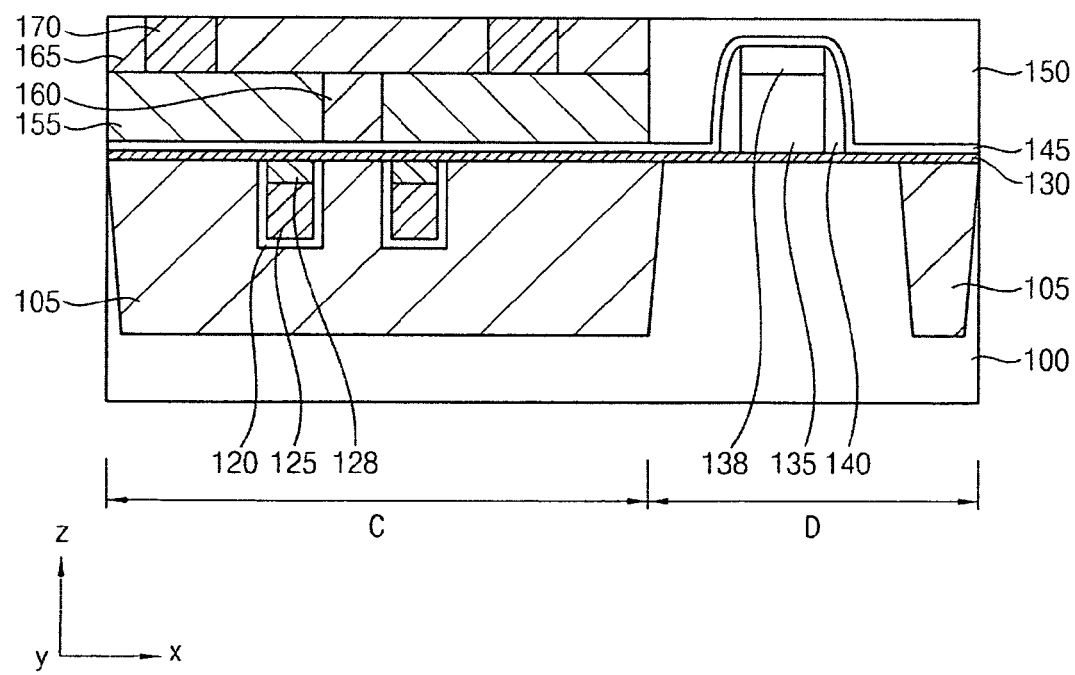

Referring to FIGS. 7A, 7B, and 7C, the first insulating pattern 150, the capping pattern 165 may be selectively etched to form recesses for forming the second insulating pattern 170. The recesses for forming the second insulating pattern 170 may extend along a direction, e.g., y-direction, crossing a direction, e.g., x-direction, along which the first conductive pattern 155 extends. The recesses for forming the second insulating pattern 170 may extend along opposing sides of the active areas 103.

The second insulating pattern 170 may include a same material as the capping pattern 165, 165', e.g., silicon nitride. More particularly, e.g., the second insulating pattern 170 and the capping pattern 165, 165' may be exactly a same material and adjacent portions thereof may flow together continuously. After depositing material for forming the second insulating pattern 170, planarization, e.g., CMP or etchback, may be performed to planarize the second insulating pattern 170 and the capping pattern 165, 165'. Respective portions of the second insulating pattern 170 and the capping pattern 165, 165' may establish a protection path substantially corresponding to a boundary of the active areas 103, respectively.

The first insulating pattern 150 may be selectively removed, e.g., portions of the first insulating pattern 150 in the cell region C may be selectively removed.

Figure 8A:
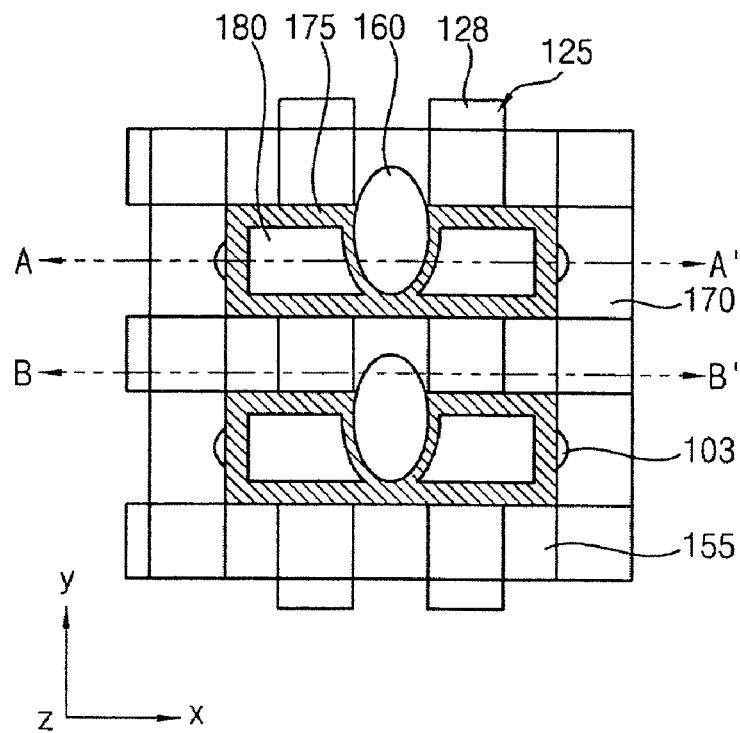
Figure 8B:
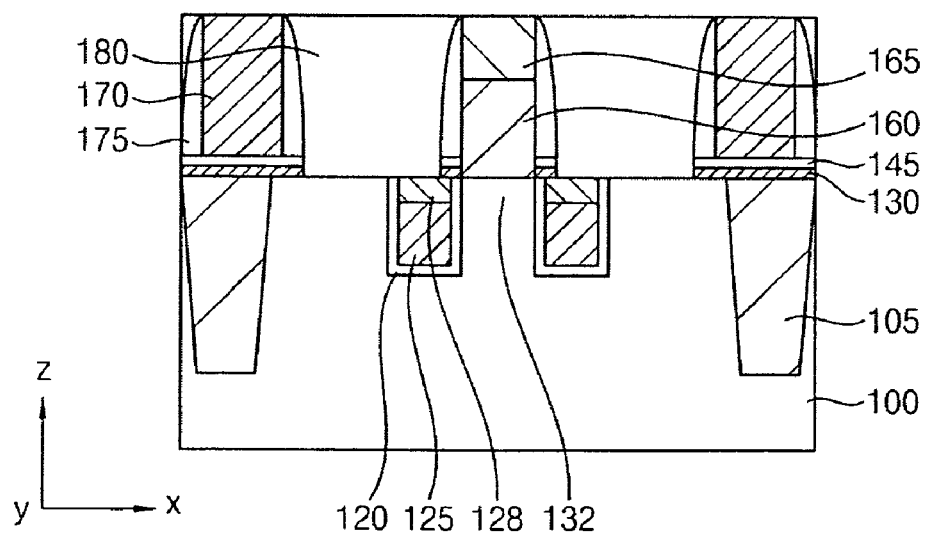
Figure 8C:
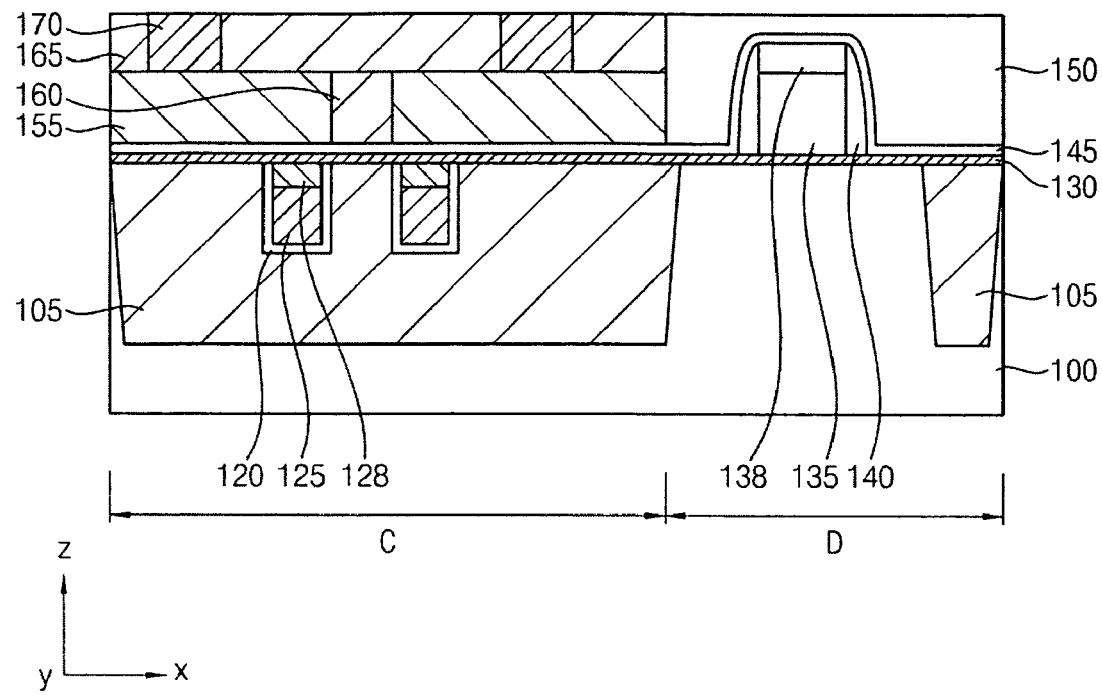

Referring to FIGS. 8A, 8B, and 8C, a spacer 175 may be arranged along sidewalls of the first conductive pattern 155, the second conductive pattern 160, the capping pattern 165, 165' and/or the second insulating pattern 170. The spacer 175 may be formed using deposition and etchback. The spacer 175 may include, e.g., silicon nitride.

More particularly, in some embodiments, each of the active areas 103 may be associated with a plurality of the gate electrodes 125. For example, each of the active areas 103 may be associated with two of the gate electrodes 125 and each pair of the gate electrodes 125 may share a common one of the source/drain regions 132 therebetween. As shown in FIG. 8A, e.g., the second insulating pattern 170 and the capping pattern 165, 165' may establish a protection path substantially corresponding, at least in part, to a boundary of, e.g., the second conductive pattern 160 associated with the common one of the source/drain regions 132 and the respective portion of the active region 103.

Figure 9A:
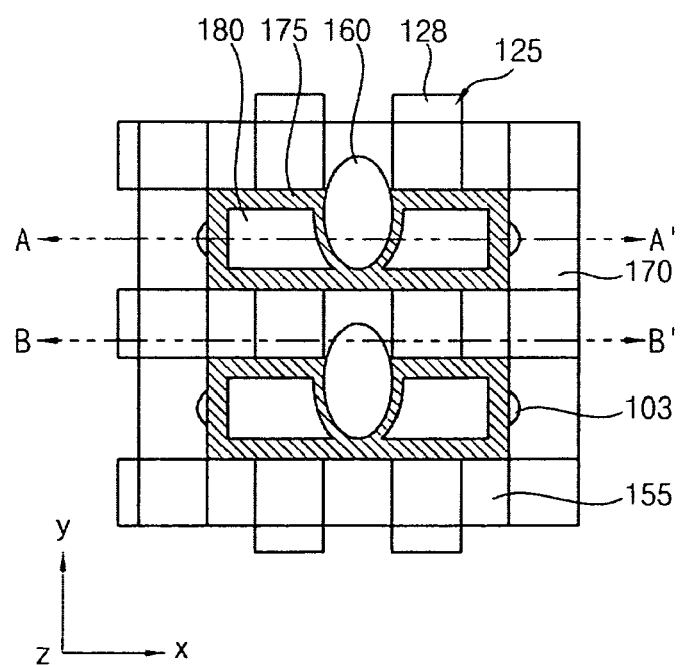
Figure 9B:
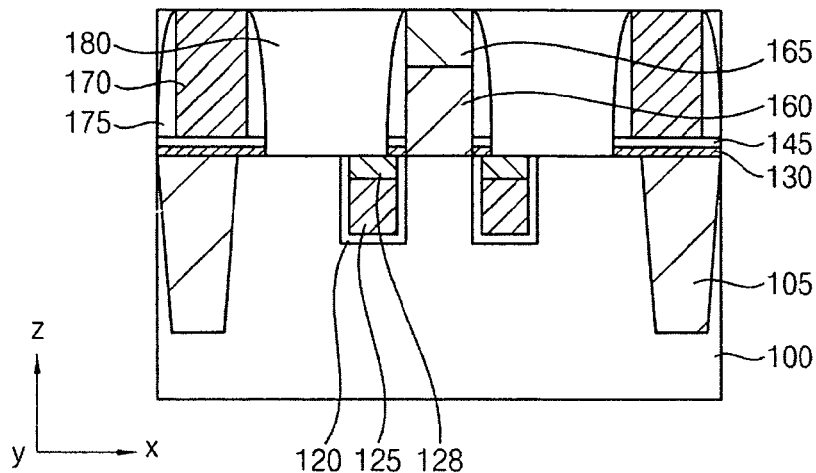
Figure 9C:
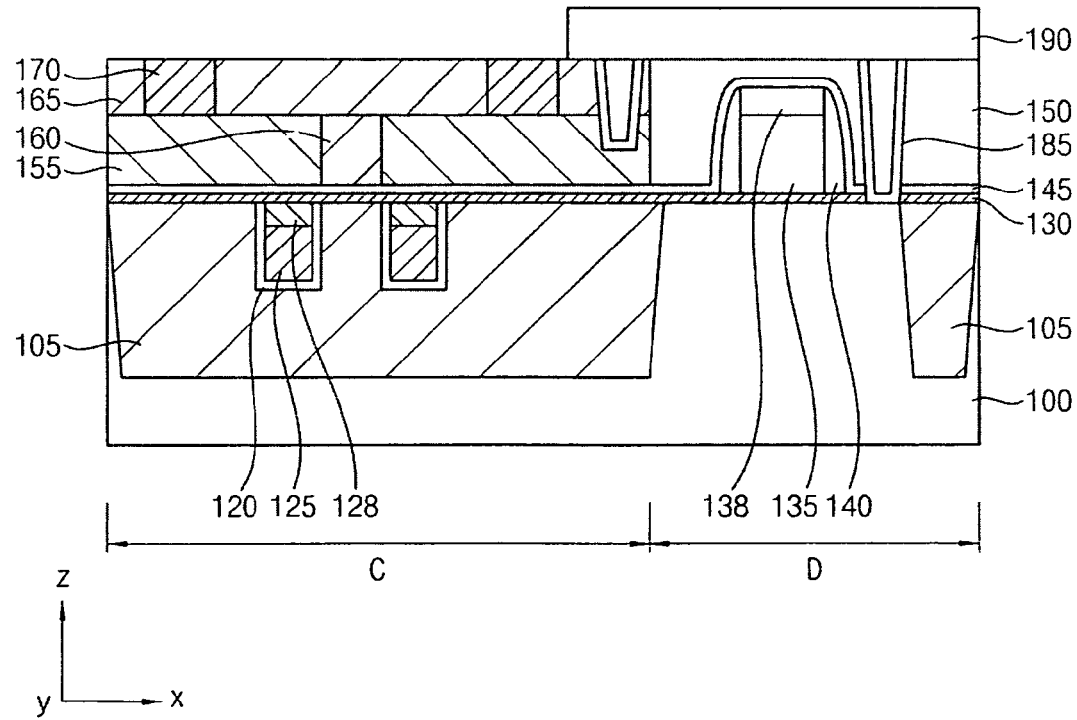

Referring to FIGS. 9A, 9B, and 9C, capacitor pads 180 may be arranged within a space at least partially defined by the spacers 175. The capacitor pads 180 may include, e.g., metal, polysilicon, etc. The capacitor pads 180 may be formed using, e.g., deposition and CMP.

Figure 10A:
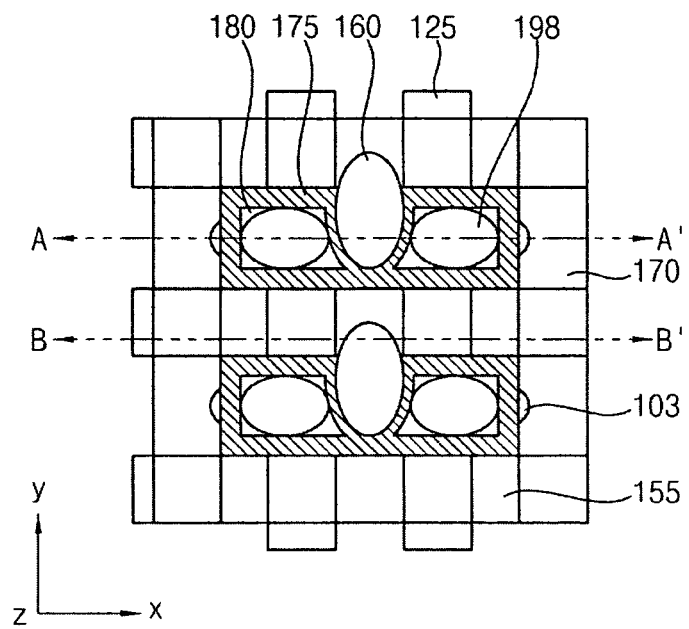
Figure 10B:
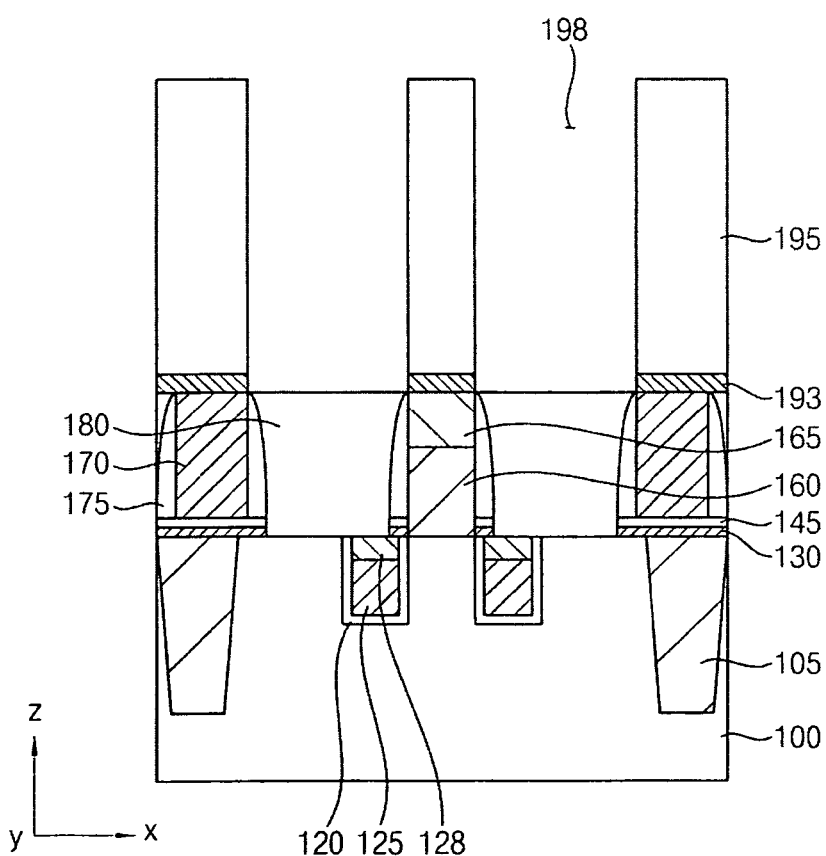
Figure 10C:
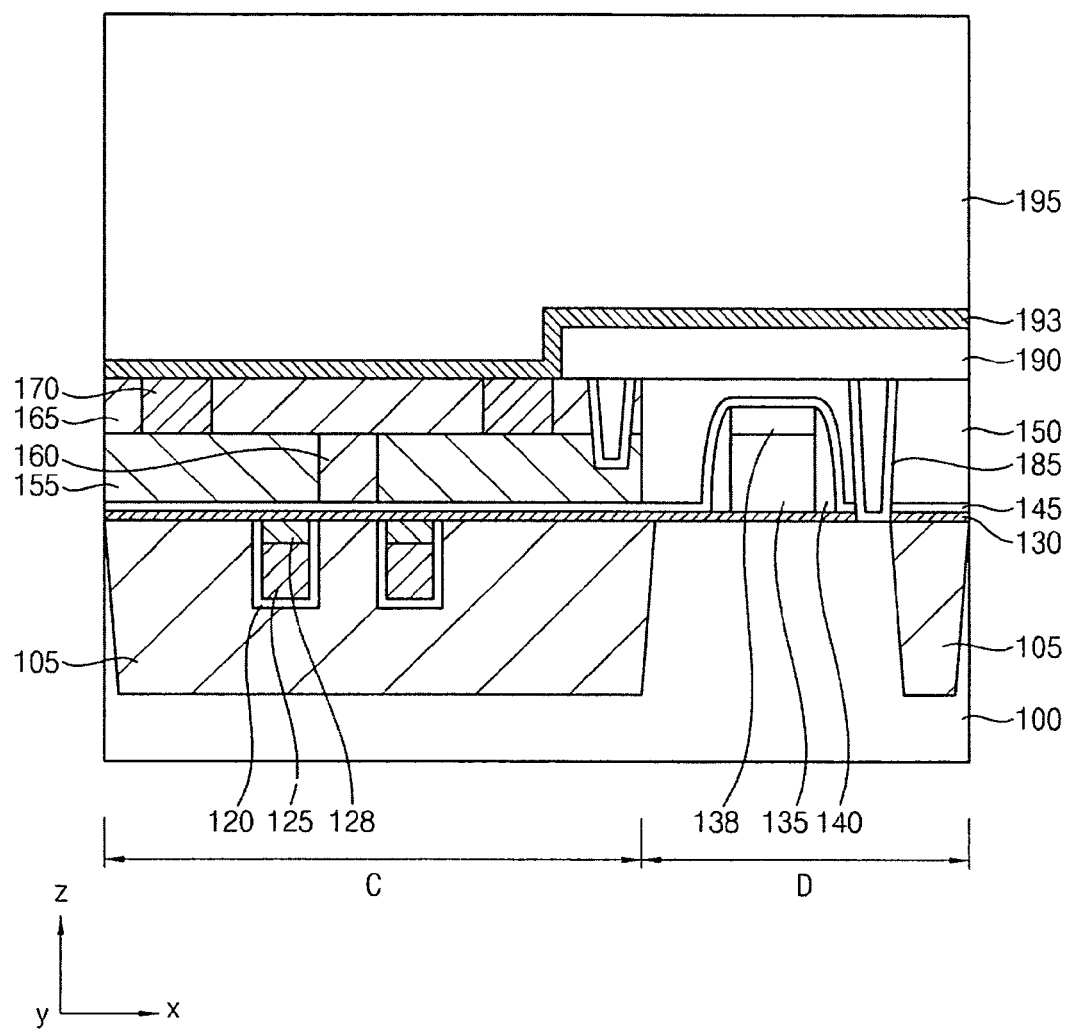

Referring to FIGS. 10A, 10B, and 10C, the second etch stop layer 193 may be formed on the semiconductor substrate 100, including, e.g., the capacitor pads 180, the spacers 175, the capping patterns 165, 165', etc. An insulating layer 195 including, e.g., oxide, may be formed on the second etch stop layer 193. The second etch stop layer 193 and the insulating layer 195 may be selectively patterned to form one or more capacitor recesses 198 corresponding to where capacitors may be formed. The insulating layer 195 and the second etch stop layer 193 may be selectively patterned using, e.g., photoresist and etching. The capacitor recesses 198 may correspond to portions of the insulating layer 195 and the second etch stop layer 193 overlapping the capacitor pads 180, respectively. Known and/or conventional processes may be used to form capacitors in the capacitor recesses 198, respectively. For example, a capacitor lower electrode 200, a capacitor dielectric 205, and a capacitor upper electrode 210 (see FIGS. 1A and 1B) may be formed in the capacitor recesses 198.

Embodiments are not limited to the exemplary methods and/or devices illustrated in FIGS. 1 through 10C. For example, in the exemplary embodiments illustrated in FIGS. 5A through 7C, the first conductive pattern 155 is illustrated as being arranged on the semiconductor substrate 100 before the second insulating pattern 170 is arranged. However, in some embodiments, e.g., the second insulating pattern 170 may be arranged before the first conductive pattern 155 is arranged.

Figure 11:
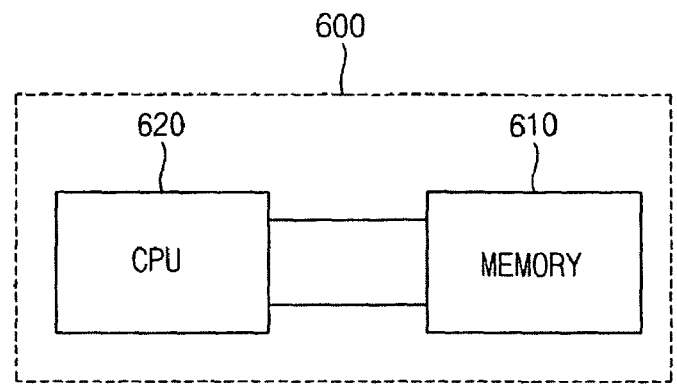
FIG. 11 illustrates a block diagram of an exemplary embodiment of a system employing the exemplary DRAM device of FIGS. 1A, 1B, and 1C.

FIG. 11 illustrates a block diagram of an exemplary embodiment of a system 600 employing the exemplary DRAM device 10 of FIGS. 1A, 1B, and 1C. The system 600 may include a central processing unit (CPU) 620 and a memory 610. The memory 610 may correspond to the exemplary DRAM device 10 of FIGS. 1A, 1B, and 1C. The system 600 may be, e.g., a flash memory system, etc. More particularly, the system 600 may be, e.g., a BCAT DRAM-flash memory system. The system 600 may be employed in, e.g., mobile systems such as a PDA, a portable computer, a web tablet, a wireless phone, a mobile phone, a digital music player, a memory card, and/or transmission/receiving systems, etc. The memory card may be a card meeting, e.g., any industry standard for consumer devices, e.g., computer, digital camera, etc.

Figure 12:
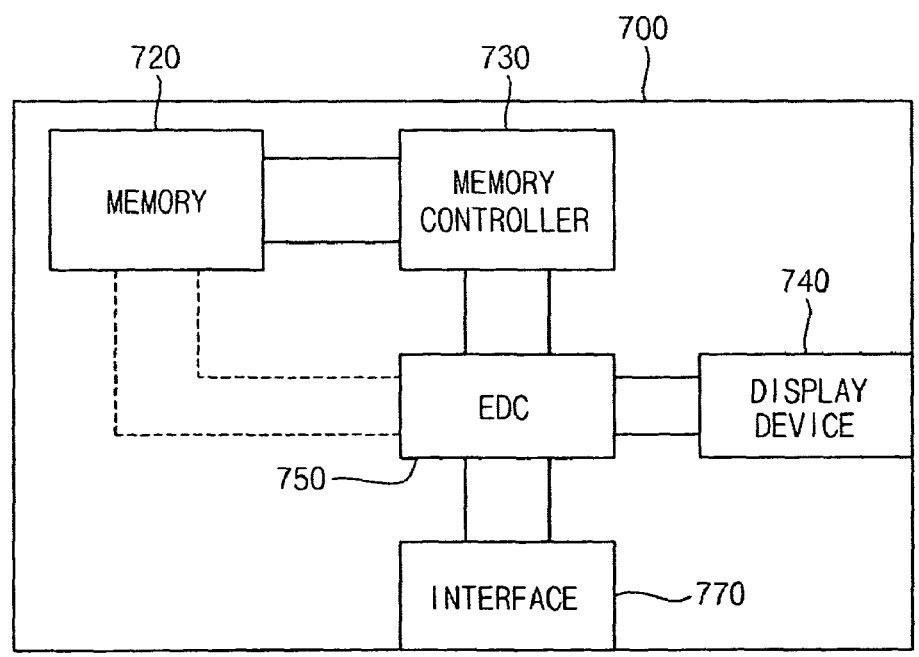
FIG. 12 illustrates a block diagram of another exemplary embodiment of a system employing the exemplary DRAM device of FIGS. 1A, 1B, and 1C.

FIG. 12 illustrates a block diagram of another exemplary embodiment of a system 700 employing, e.g., the DRAM device 10 of FIGS. 1A, 1B, and 1C. The system 700 may include a memory 710, a memory controller 730, a display/presentation device 740, an encoder and decoder (EDC) 750, and an interface 770. The memory 710 may include a plurality of semiconductor devices including one or more of the features described above with regard to the DRAM device 10 of FIG. 1. Data may be input/output to/from the memory 720 via the memory controller 730. The EDC 750 may receive control signals, which may be input/output via the interface 770. The interface 770 may conform to a known standard, e.g., USB, firewire, etc. The interface 770 may include more than one interface, e.g., firewire interface, and/or USB interface, etc. The EDC 750 may encode data for storage in the memory 720. The EDC 750 may decode output from the memory 720. The EDC 750 may include multiple decoders for different data types based on different data formats. For example, the EDC 750 may include an MPEG encoder for video data and an MP3 encoder for audio data. The system 700 may be, e.g., a display system.

In the figures, the dimensions of layers and regions may be exaggerated for clarity of illustration. It will also be understood that when an element is referred to as being "on" another element, it can be directly on the other element, or intervening elements may also be present. In addition, it will also be understood that when an element is referred to as being "between" two elements, it may be the only element between the two elements, or one or more intervening elements may also be present. Additionally, it will be understood that when an element is referred to as being "between" two elements, it may be physically arranged between facing/overlapping portions of the two elements, it may be physically arranged such that one of the elements is below it and the other element is above it, or it may be such that it is along a path connecting the two elements. Like reference numerals refer to like elements throughout the specification.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of:" For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A semiconductor device, comprising:
   a semiconductor substrate including isolations defining active regions of the semiconductor substrate;
   a plurality of buried gate electrodes extending below an upper surface of the active regions of the semiconductor device;
   a plurality of bit lines extending on the semiconductor substrate along a first direction;
   a plurality of insulating patterns extending on the semiconductor substrate along a second direction that crosses the first direction; and
   a plurality of capping patterns extending over the bit lines, wherein the insulating patterns and the capping patterns both include insulating material and at least a portion of corresponding ones of the insulating patterns and the capping patterns are in direct contact with each other.

2. The semiconductor device as claimed in claim 1, wherein each of the plurality of bit lines includes a conductive pattern protruding from the respective bit line and directly contacting and overlapping a corresponding one of the active regions of the semiconductor substrate.

3. The semiconductor device as claimed in claim 2, wherein each of the conductive patterns is arranged between two adjacent ones of the buried gate electrodes and overlaps a common source/drain region of the adjacent buried gate electrodes in the respective active region of the semiconductor substrate.

4. The semiconductor device as claimed in claim 2, wherein the bit lines are arranged directly on the semiconductor substrate.

5. The semiconductor device as claimed in claim 2, wherein the capping pattern extends over the conductive patterns.

6. The semiconductor device as claimed in claim 1, wherein the insulating patterns and the capping pattern form a closed insulating path along a plane parallel to the upper surface of the semiconductor substrate.

7. The semiconductor device as claimed in claim 1, further comprising a plurality of conductive pads arranged on the semiconductor substrate.

8. The semiconductor device as claimed in claim 7, wherein the conductive pads are arranged between adjacent portions of the capping patterns and the insulating patterns.

9. The semiconductor device as claimed in claim 8, wherein the conductive pads are surrounded by respective portions of the capping patterns and the insulating patterns along a plane extending along the first and second directions.

10. The semiconductor device as claimed in claim 7, wherein the conductive pads are arranged directly on respective source/drain regions of the semiconductor substrate.

11. The semiconductor device as claimed in claim 7, further comprising a spacer between each of the conductive pads and adjacent respective portions of the insulating patterns and the capping patterns.

12. The semiconductor device as claimed in claim 11, wherein sidewalls of the conductive pads are surrounded by the respective spacer.

13. The semiconductor device as claimed in claim 1, wherein the insulating patterns overlap respective portions of the isolations.

14. The semiconductor device as claimed in claim 1, wherein the first direction is substantially and/or completely perpendicular to the second direction.

15. The semiconductor device as claimed in claim 1, wherein the capping pattern and the insulating patterns include the same one or more insulating materials.

16. The semiconductor device as claimed in claim 1, wherein the capping pattern and the insulating pattern include silicon nitride.

17. The semiconductor device as claimed in claim 1, wherein upper surfaces of the capping pattern and the insulating pattern extend along a same plane.

18. A system, comprising:
a controller; and
a memory device, the memory device including:
- a semiconductor substrate including isolations defining active regions of the semiconductor substrate;
- a plurality of buried gate electrodes extending below an upper surface of the active regions of the semiconductor device;
- a plurality of bit lines extending on the semiconductor substrate along a first direction;
- a plurality of insulating patterns extending on the semiconductor substrate along a second direction that crosses the first direction; and
- a plurality of capping patterns extending over the bit lines,
wherein the insulating patterns and the capping patterns both include insulating material and at least a portion of corresponding ones of the insulating patterns and the capping patterns are in direct contact with each other,
wherein the controller is adapted to program data in and erase data from the memory device.

19. The system as claimed in claim 18, wherein the memory device is a DRAM-flash type memory system.

* * * * *